(12) United States Patent
Chen et al.

(10) Patent No.: US 10,640,369 B2
(45) Date of Patent: May 5, 2020

(54) MICROELECTROMECHANICAL SYSTEM (MEMS) DEVICES

(71) Applicant: HEWLETT-PACKARD DEVELOPMENT COMPANY, L.P., Houston, TX (US)

(72) Inventors: Chien-Hua Chen, Corvallis, OR (US); Devin Alexander Mourey, Corvallis, OR (US); Michael W. Cumbie, Corvallis, OR (US); Si-lam J. Choy, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/094,287

(22) PCT Filed: Jul. 13, 2016

(86) PCT No.: PCT/US2016/042130
§ 371 (c)(1),
(2) Date: Oct. 17, 2018

(87) PCT Pub. No.: WO2018/013109
PCT Pub. Date: Jan. 18, 2018

(65) Prior Publication Data
US 2019/0119104 A1 Apr. 25, 2019

(51) Int. Cl.
*B32B 38/10* (2006.01)
*B81B 7/04* (2006.01)
(Continued)

(52) U.S. Cl.
CPC ............ *B81B 7/04* (2013.01); *B81C 1/00119* (2013.01); *G01C 19/00* (2013.01);
(Continued)

(58) Field of Classification Search
CPC ..... H01L 2924/00014; H01L 2924/181; H01L 2224/97; H01L 2224/12105;
(Continued)

(56) References Cited

U.S. PATENT DOCUMENTS 6,821,819 B1 11/2004 Benavides et al.
8,629,546 B1 1/2014 Scanlan
(Continued)

OTHER PUBLICATIONS

"Fan-out Wafer Level Packaging" (Web Page); Mar. 16, 2015; http://www.spts.com/tech-insights/advanced-packaging/fowlp.
Stoyanov, S.; "Design for Reliability for System-in-Package"; Dec. 18, 2007; http://www.lboro.ac.uk/microsites/research/iemrc/documents/EventsDocuments/System%20in%20Package%20Wkshop%20Dec07/Stoyanov%20System%20in%20Package%20%20Event.pdf.

*Primary Examiner* — Caridad Everhart
(74) *Attorney, Agent, or Firm* — Fabian VanCott

(57) ABSTRACT

One example provides a microelectromechanical systems (MEMS) device that includes a number of silicon die over-molded with an overmold material, a number of active areas formed on the silicon die, the active areas including at least one sensor to sense a number of attributes of a fluid introduced to the at least one sensor, and a fan-out layer coupled to the silicon die, the fan-out layer including a number of fluid channels formed therein that interface with active areas of the silicon die and allow the fluid to flow to the at least one sensor.

20 Claims, 6 Drawing Sheets

(51) Int. Cl.
*G01P 15/08* (2006.01)
*B81C 1/00* (2006.01)
*G01C 19/00* (2013.01)

(52) U.S. Cl.
CPC .. *G01P 15/0802* (2013.01); *B81B 2201/0214* (2013.01); *B81B 2201/0235* (2013.01); *B81B 2201/0242* (2013.01); *B81B 2201/036* (2013.01); *B81B 2201/058* (2013.01); *B81B 2207/07* (2013.01); *B81C 2201/0184* (2013.01)

(58) Field of Classification Search
CPC .... B81B 2201/0235; B81B 2201/0242; B81B 7/02; B81B 2207/07; B81B 2207/0214; B81B 2207/058; B81B 2207/091; B81C 2203/0154; B81C 1/00119; B81C 2201/0184
See application file for complete search history.

(56) References Cited

U.S. PATENT DOCUMENTS

| | | |
|---|---|---|
| 9,029,962 B1 | 5/2015 | Dreiza et al. |
| 2004/0087043 A1* | 5/2004 | Lee ................... B81C 1/00269 438/6 |
| 2006/0019333 A1* | 1/2006 | Rodgers ............... B01D 61/002 435/41 |
| 2009/0308578 A1 | 12/2009 | Bernstein |
| 2011/0229375 A1* | 9/2011 | Ehrenpfordt .......... B01L 3/5027 422/68.1 |
| 2014/0227147 A1 | 8/2014 | Beyer et al. |
| 2015/0014855 A1 | 1/2015 | Yap et al. |
| 2015/0061048 A1 | 3/2015 | Escher-Poeppel |
| 2015/0311132 A1 | 10/2015 | Kuo |

\* cited by examiner

MICROELECTROMECHANICAL SYSTEM (MEMS) DEVICES

BACKGROUND

Microelectromechanical systems (MEMS) include a number of components that are between 1 and 100 micrometers in size (i.e. 0.001 to 0.1 mm), and the MEMS devices as a whole may range in size from 20 micrometers to a millimeter (i.e. 0.02 to 1.0 mm). MEMS may include a central unit that processes data such as a microprocessor, and a number of components that interact with the surroundings such as microsensors and microactuators.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
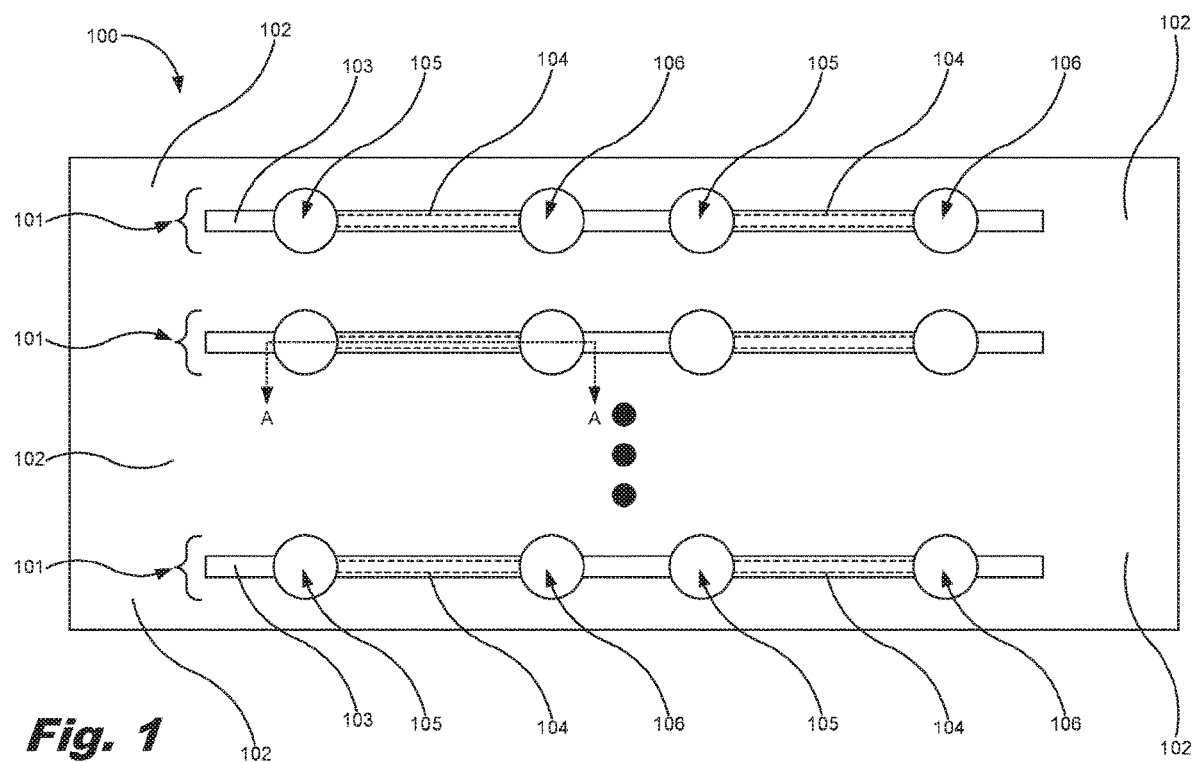
FIG. 1 is a block diagram of an array of Microelectromechanical systems (MEMS) devices, according to one example of the principles described herein.

MEMS devices may be used in several different areas of technology including in inkjet printers, which use piezoelectrics or thermal bubble ejection to deposit ink on paper; accelerometers and MEMS gyroscopes for automatically sensing and balancing flying characteristics of roll, pitch and yaw, in deployment of airbags within automobiles, in consumer electronics devices, gaming platforms, personal media players, cell phones, digital cameras and in PCs to park the hard disk head when free-fall is detected, to prevent damage and data loss. MEMS devices may also be used in silicon pressure sensors such as car tire pressure sensors and disposable blood pressure sensors, and in switching technology, which is used for switching technology and alignment for data communications systems. Applications of MEMS devices may also include bio-MEMS applications in medical and health related technologies including lab-on-chip (LOC) applications, biosensors, and chemosensors. MEMS devices may also be used to accelerate fluid through various fluid channels within a bio-MEMS device.

MEMS devices, however, may be expensive to manufacture. This is at least partly due to a MEMS device's inclusion of sensor and actuator silicon die that may be costly to manufacture in both materials and processing. This may have a preclusive effect on markets' ability to leverage MEMS technologies in their various areas of technologies.

Further, while the size of a MEMS device may have several advantages, its size may preclude the MEMS device from interfacing with other processes. For example, a bio-MEMS device may be used to detect the properties of an analyte. However, in order to allow for a technician to introduce the analyte into the MEMS device, a large silicon die may be included in the MEMS device in order to allow for input/output ports to be spaced out from one another. The spaced-out layout of the input/output ports of the silicon die provide enough space for the technician to introduce the analyte to the MEMS device, but greatly increase the cost of the MEMS device due to the extra silicon used to form the die.

Examples described herein provide a microelectromechanical systems (MEMS) device. The MEMS device includes a number of silicon die overmolded with an overmold material, a number of active areas formed on the silicon die, the active areas including at least one sensor to sense a number of attributes of a fluid introduced to the at least one sensor, and a fan-out layer coupled to the silicon die, the fan-out layer including a number of fluid channels formed therein that interface with active areas of the silicon die and allow the fluid to flow to the at least one sensor.

The MEMS device may further include a number of fluid input/output ports defined in the fan-out layer coupling the fluid channels to an exterior environment. The active areas of the MEMS device further include a number of actuators to cause the fluid introduced into the fluid channels to interact with the sensors. Further, the active areas include a reagent storage to store a number of reagents to react with the fluid introduced into the fluid channels.

The MEMS device includes a surface area including at least a majority of overmold material relative to silicon of the silicon die. In one example, a majority is more than 50%. In another example, the MEMS device includes a surface area including at least 60% of overmold material relative to silicon of the silicon die. In still another example, the MEMS device includes a surface area including at least 70% of overmold material relative to silicon of the silicon die. In still another example, the MEMS device includes a surface area including at least 80% of overmold material relative to silicon of the silicon die. In one example, the overmold material is an epoxy mold compound (EMC).

Examples described herein also provide a method of forming fluid channels in a microelectromechanical systems (MEMS) device. The method includes overmolding a number of dies with an overmold material to form a coplanar package, the dies including a number of electrically active devices, and forming a fan-out layer on the coplanar package to increase distances between a number of features of the die, the fan-out layer including a number of fluid channels formed therein that interface with the electrically active devices of the die and cause a fluid to flow to the electrically active devices. The method further includes coupling a carrier to the die via a releasable adhesive, overmolding the die using the carrier to handle the die, removing the carrier, and forming the fan-out layer in place of the carrier. The method further includes coupling an electrical redistribution layer (RDL) positioned between the fan-out layer and the die to electrically couple the electrically active devices to an external circuit.

Forming the fan-out layer includes depositing material via photolithography deposition processes. The fan-out layer includes a radiation-sensitive chemical photoresist. The photolithography deposition process includes depositing a layer of the photoresist, irradiating the layer of the photoresist with a pattern of radiation, and remove portions of the photoresist not cross-linked using a developer. Thus, the photoresist material may be a positive or negative photoresist material so that irradiated portion may either stay or be washed away during a development process.

Examples described herein also provide a lab-on-chip system including a plurality of silicon dies, a number of electrically active devices disposed on a first side of the silicon dies, an overmold material overmolded over all sides of the silicon dies other than the first side, a fan-out layer coupled to each of the silicon die, the fan-out layer including a number of fluid channels formed therein that interface with the electrically active devices, and an electrical redistribution layer (RDL) positioned between the fan-out layer and the die to electrically couple the electrically active devices to an external circuit, The lab-on-chip system further includes a number of reagents disposed within the lab-on-chip system to react with a fluid introduced into the lab-on-chip system. The fan-out layer includes a manifold including a plurality of the fluid channels.

Further, the lab-on-chip system includes a plurality of fluid input/output ports defined in the fan-out layer coupling the fluid channels to an exterior environment. The fluid input/output ports are spaced out with respect to one another a greater distance than a dimension of a plane of the silicon die that interfaces with the fan-out layer.

Thus, examples described herein provide a coplanar, overmolded sliver die) microfluidic devices for use in connection with the detection of attributes of a liquid analyte introduced within the device. The invention may be embodied as a microelectromechanical system (MEMS) having physical architectures to move fluids through the device and electrical circuits to determine a number of attributes of the analyte. The microfluidic devices may be referred to as a microfluidic diagnostic device, a lab-on-chip device, a bioreactive device, a biomedical device, or similar device into which fluids may be introduced and analyzed. The coplanar portion of the device is formed by overmolding three sides of a sliver die opposite an active area of the die, leaving the active area of the die exposed. The active area of the sliver die includes a number of actuators and/or sensors used to detect the attributes of the analyte within the device. A fan-out layer is deposited on top of the active area of the sliver die and portions of the overmolded portion to form a number of fluid channels between the sliver die and the fan-out layer and within the fan-out layer. Also formed within the fan-out layer is a number of input/output ports to receive the analyte fluid.

As used in the present specification and in the appended claims, the term "a number of" or similar language is meant to be understood broadly as any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Turning now to the figures, FIG. 1 is a block diagram of an array (100) of microelectromechanical systems (MEMS) devices (101), according to one example of the principles described herein. The array (100) includes a number of die (103) overmolded within an overmold material (102). In one example, the die (103) are silicon die. Further, in one example, the overmold material (102) may include any moldable material such as a polymer material. In one example, the polymer material may include a thermoset polymer such as an epoxy mold compound. In one example, the die (103) is a sliver die where the sliver die includes a thin silicon, glass or other substrate having a thickness on the order of 300 µm or less. In one example, a sliver die may have a ratio of length to width (L/W) of at least three.

Each of the MEMS devices (101) within the array (100) may include a number of active areas (104) associated with each of the dies (103). The active areas (104) may include a number of sensors to sense or detect a number of attributes or measurable properties of a fluid or other analyte introduced to the active area (104) of the die (103). For example, the sensors may detect the presence of the analyte, the existence of a chemical in the analyte, or a chemical property of the analyte. The sensors may sense a property of the analyte such as, for example, the absorption, albedo, boiling point, capacitance, color, concentration, density, dielectric, electric charge, electrical conductivity, electrical impedance, electric field, electric potential, flow rate, fluidity, inductance, Intrinsic impedance, luminance, luminescence, luster, magnetic field, magnetic flux, mass, melting point, opacity, resistivity, reflectivity, refractive index, solubility, specific heat, temperature, thermal conductivity, viscosity, volume, other properties of the analyte, or combinations thereof.

The MEMS devices (101) may further include a fan-out layer (FIG. 4, 111) including a number of input ports (105) and output ports (106) depicted in FIG. 1. The input ports (105) are used to introduce the analyte to the MEMS devices (101) and into a number of fluid channels (FIG. 4, 401) formed within the MEMS device (101). The output ports (106) may, in some examples, be provided to allow the analyte to exist the MEMS device (101). However, in another example, the output ports (106) may function as an additional input port through which a second or subsequent analyte is introduced. In this example, the output ports (106) may receive a second analyte, a subsequent analyte, a reactant, another solution, or combinations thereof in order to provide additional analysis in connection with the MEMS device (101).

Figure 4:
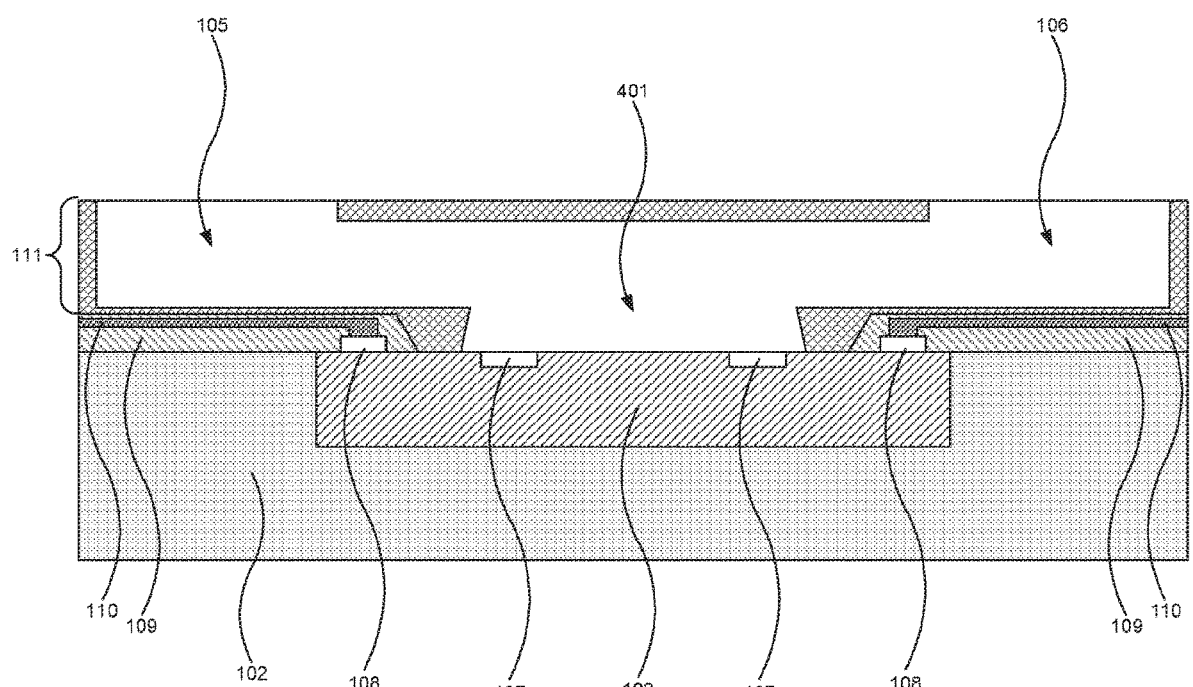

The ellipsis depicted in FIG. 1 indicates that any number of die (103) may be included in the array (100). In one example, a plurality of dies (103) are included in the array (100). The overmolding of the die (103) within the overmold material (102) provides for the ability to fan-out or physically increase the distance between the input/output ports (105, 106) formed within the fan-out layer (FIG. 4, 111) while limiting the amount of die material used in forming the die (103). The die (103), in some examples, may be made of a relatively more expensive material than the overmold material such as, for example, silicon. If for example, the area depicted in FIG. 1 were all formed from, for example, silicon, the cost of the MEMS device (100) would be relatively higher. This is especially the case if the silicon die (103) is to include distances between the input/output ports (105, 106) that are relatively similar to the distances provided by the fan-out layer (FIG. 4, 111). Thus, examples described herein provide for a fan-out of input/output ports (105, 106) while reducing costs in materials and manufacturing of the MEMS devices (101) and the overall array (100). In one example, a plurality of MEMS devices (101) within an array (100) may be overmolded within the overmold material (102) and cut or "diced" into a number of separate portions of the array (100) where each portion includes at least one MEMS device (101), and, in one example, may include a plurality of MEMS devices (101).

The active areas (104) may also include a number of actuators to effect a change in the fluids or other analyte for sensing purposes. The actuators may include, for example, fluid pumps to pump fluid throughout a number of fluid channels (FIG. 4, 401) within the MEMS device (101), fluid mixers including structures within the MEMS device (101), fluid pumps or combinations thereof to mix the analyte or other fluids, reagent storages to store an amount of reagent to react with the analyte, other types of actuators, or combinations thereof. In one example, a number of application specific integrated circuits (ASICs) may also be included within the MEMS device (101).

As mentioned above, the MEMS devices (101) may be used in many applications including, for example, bio-MEMS applications. In some types of bio-MEMS applications, the MEMS devices (101) are configured as lab-on-chip devices. Lab-on-chip (LOC) devices integrate a number of laboratory functions on a single chip of approximately a few square millimeters to a few square centimeters to achieve automation and high-throughput screening. LOC devices handle small fluid volumes down to less than picoliters. The LOC devices may be used in a polymerase chain reaction (PCR) process where a single to a few copies of a sample of deoxyribonucleic acid (DNA) is amplified to generate millions of copies of the DNA sequence embodied in that sample of DNA. LOC systems use PCR amplification as part of a process flow where several sub-processes such as sample preparation take place, and into which fluids are introduced into the LOC MEMS device to complete the process. In a LOC MEMS device application a fanning-out or separation of fluidic interconnects may be achieved, which enables decoupling of the silicon die (103) area from the fluidic input/output ports (105, 106) in order to keep the overall cost structure low, and enable a high level of integration. For example, a LOC MEMS device may include two thermal zones and a pump that are all three separate chips within the MEMS device (101) package that may recirculate the analyte across the multiple zones for FOR-like thermal cycling, and move the fluid downstream to an integrated complementary metal-oxide-semiconductor (CMOS) image sensor as a heterogeneous package to enable optical readout of a signal in-situ. This type of LOC MEMS device is provided as an example, and any application may be employed in using the overmolded MEMS device (101) described herein.

FIGS. 2A through 4 depict a MEMS device (101) of FIG. 1 in various stages of manufacture, according to one example of the principles described herein. At FIG. 2, a die (103) may include a number of sensors, actuators, or combinations thereof to function as described above. The sensors/actuators (107) may be electrically coupled to a number of electrical pads (108) that assist in the relaying of signals to and from the sensors/actuators (107) of the die (103).

In order to handle the die (103) during the manufacturing process, the die (103) may be coupled to a carrier (202) using an adhesive (203) such as an adhesive tape. In one example, the adhesive tape may be a thermal release tape manufactured by Nitto Denko Corporation. The die (103) is attached to the carrier (202) by moving the die (103) in the direction of arrow (201) until the adhesive (203) couples the carrier (202) to the die (103) as depicted in, for example, FIG. 2B.

Figure 2A:
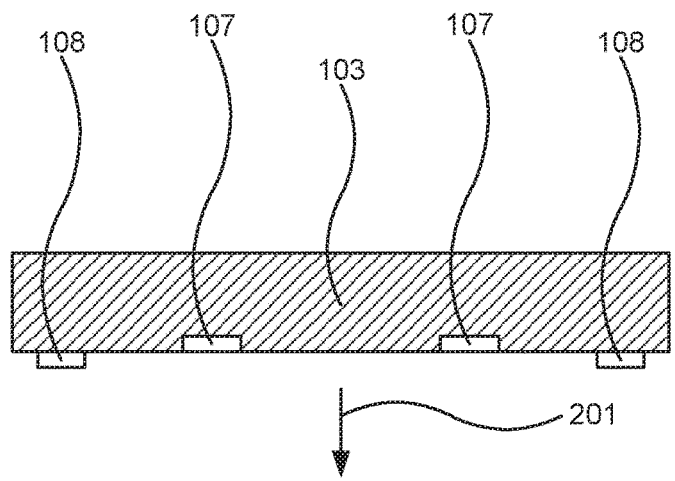
FIGS. 2A through 4 depict a MEMS device of FIG. 1 in various stages of manufacture, according to one example of the principles described herein.
Figure 2B:
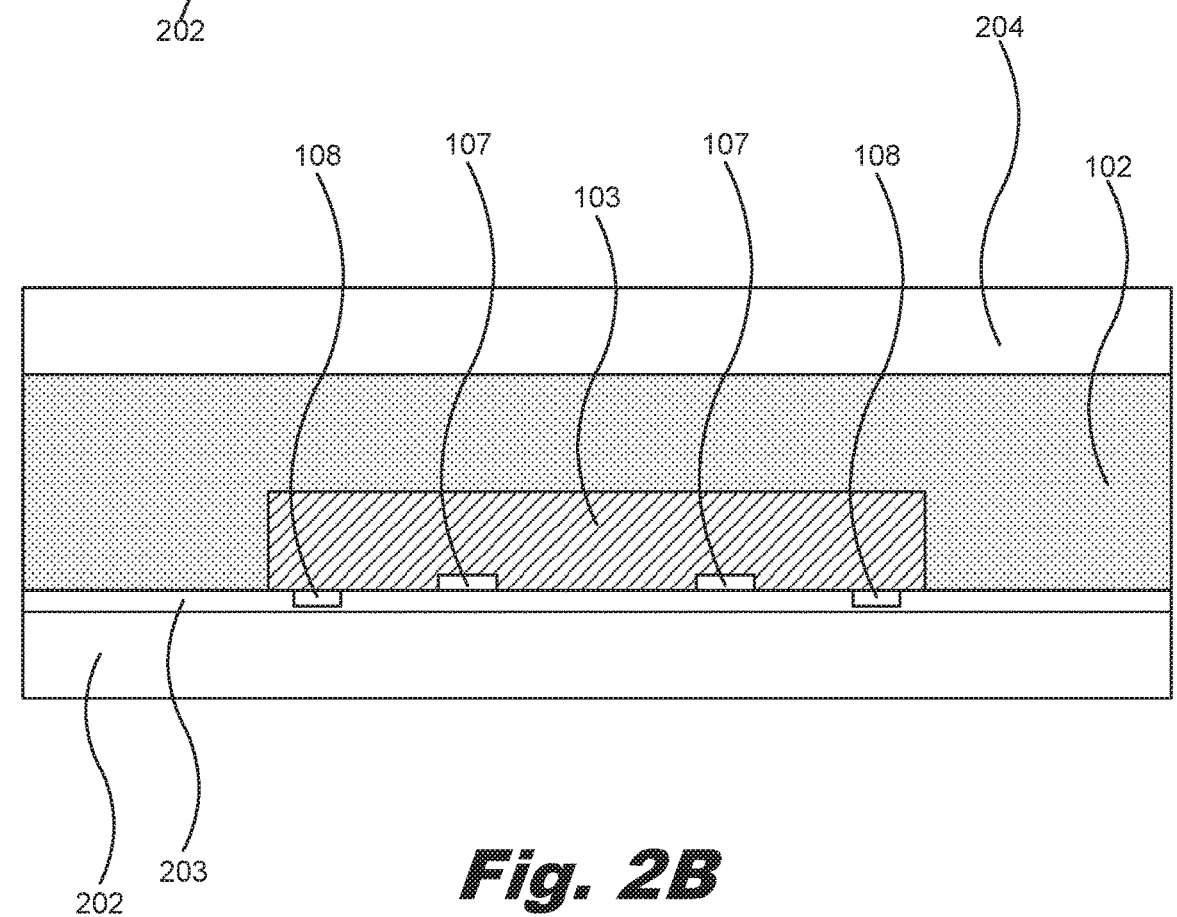

In FIG. 2B, the carrier (202) is coupled to the die (103), and an overmolding process is performed. The three exposed sides of the die (103) depicted in FIG. 2A come into contact with the overmold material (102) during overmolding. In one example, a molding tool (204) may be used to assist in the overmolding process by providing pressure and/or heat to the overmold material (102) in order to form the overmold material (102) around the die (103). In this example, the carrier (202) is inserted into a cavity of the molding tool (204) and the molding tool (204) applies pressure to the overmold material (102) to force the overmold material around the die (103).

Figure 3A:
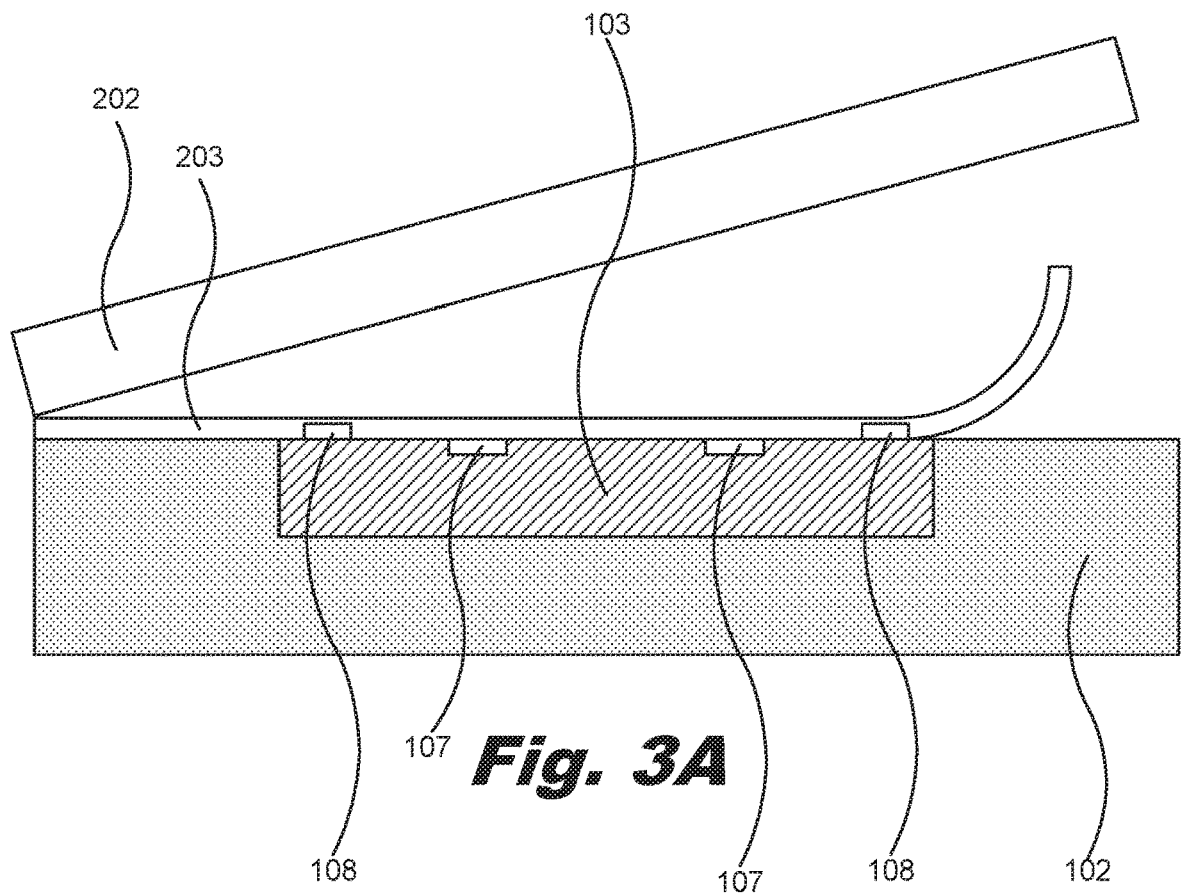

At FIG. 3A, the carrier (202) and the adhesive (203) are removed. In one example, heat may be applied to the adhesive (203) to allow the adhesive (203) to release from the die (103) and overmold material (102) as well as the carrier (202). In this example, the adhesive (203) may be exposed to approximately 170° C. to cause the adhesive (203) to release. In another example, a solvent or other releasing chemical may be applied to the adhesive (203) to separate the die (103) and overmold material (102) from the carrier (202). The die (103) and overmold material (102) may together be referred to as a co-planar package since the face of the die (103) not adjacent to the overmold material (102) is located on a common plane as the overmold material (102) that surrounds the die (103).

Figure 3B:
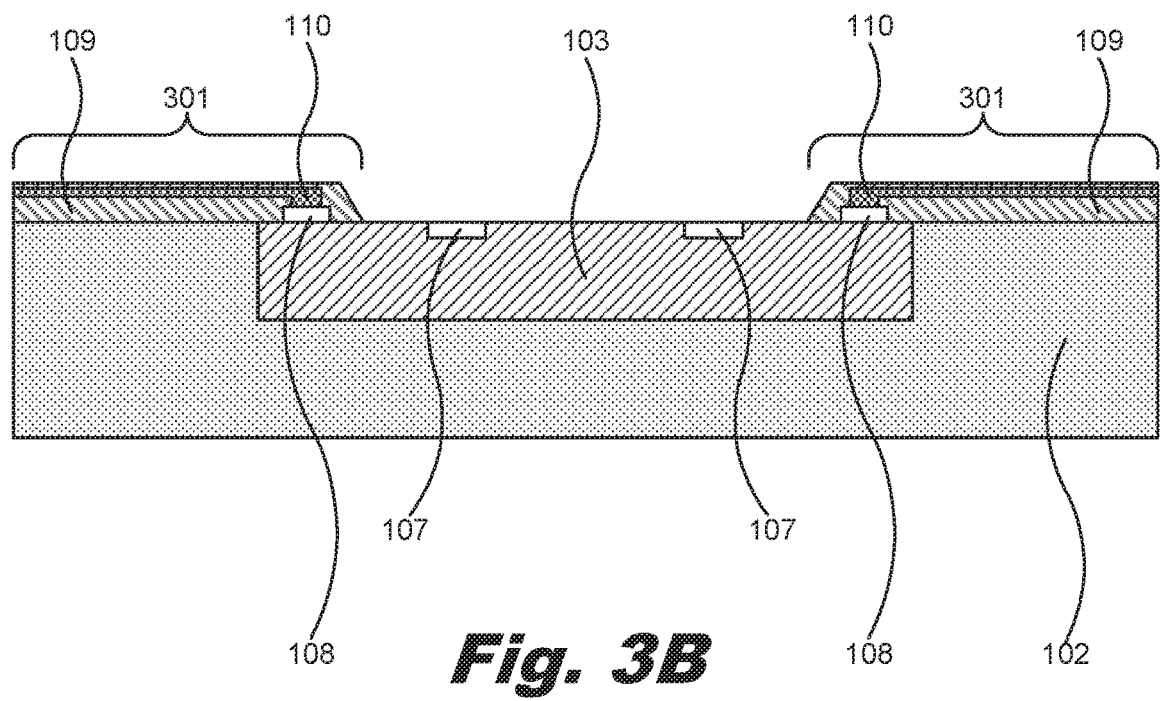

In one example, a redistribution layer (RDL) (301) may be included in the MEMS device (101) to allow for electrical signals to be relayed between the active areas (104) of the MEMS device (101) to an external processing device as depicted in FIG. 3B. This will allow the detected information to be relayed to, for example, a computing device so that a user may analyze and display information regarding the analyte. In one example, the RDL (301) may include a number of electrical traces (110) or contacts that make contact with or are electrically coupled to the electrical pads (108) of the die (103), and, in turn, contact the sensors/actuators (107). The RDL (301) may be formed through jetting of a conductive ink, through metal deposition using a shadow mask, through photoetching and deposition processes, through vapor deposition processes, integrated circuit formation processes including photolithography, other RDL formation processes, or combinations thereof.

A fan-out layer (111) is formed on the die (103), overmold material (102), and RDL (301), As mentioned above, the fan-out layer (111) provides for the die (103) within the array (100) to be separated by larger distances to allow for a user to access input/output ports (105, 106). Without the fan-out layer (111), the user's ability to interface with the small sizes of and distances between the sensors/actuators (107) may be difficult or impossible since these distances may be as small as nanometers and micrometers. The fan-out layer (111) provides for the ability to interface with the MEMS devices (101) by increasing distances between MEMS devices (101), and between the input/output ports (105, 106) and other structures of the MEMS device (101).

In one example, the fan-out layer (111) may be formed using lamination or thin-coating of a polymer material, and performing a number of photodeveloping processes to the fan-out layer (111) to form a number of fluid channels (401) within the fan-out layer (111). In another example, the fan-out layer (111) may be formed using an injection molding process where a material is injected into a mold. In still another example, the fan-out layer (111) may be formed using a three-dimensional printing process. Although one fluid channel (401) is depicted in the MEMS device (101) of FIG. 4, any number, size, shape, or type of fluid channel (401) may be formed using a number of the above processes. The fan-out layer (111) may be adhered to the die (103), overmold material (102), and RDL (301) through the processes described above in connection with the formation of the fan-out layer (111), or may be formed separately from the die (103), overmold material (102), and RDL (301) and coupled to these elements using an adhesive, and fixture device, or other coupling methods and devices.

Figure 5:
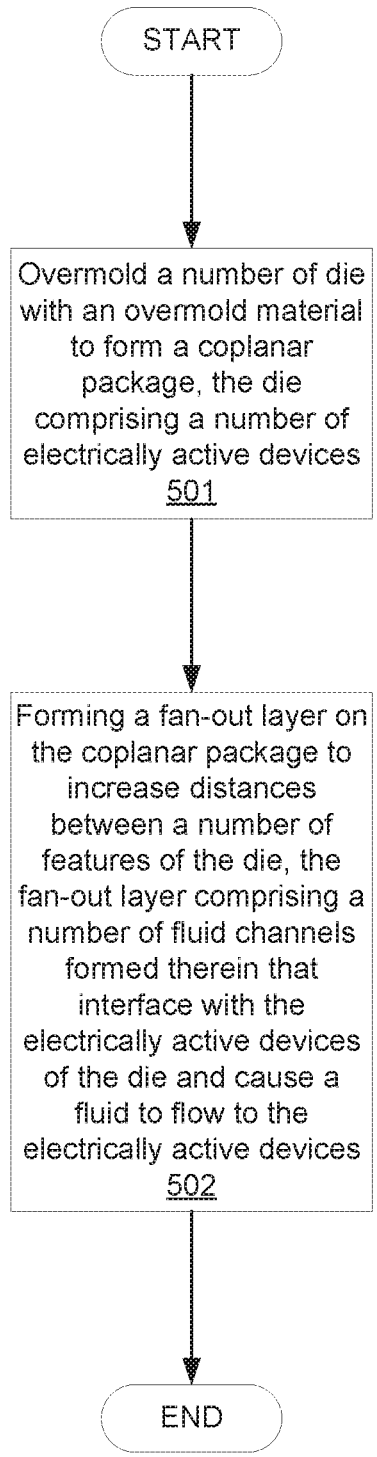
FIG. 5 is a flowchart depicting a method of forming fluid channels in a MEMS device, according to one example of the principles described herein.

FIG. 5 is a flowchart depicting a method of forming fluid channels (401) in a MEMS device (101), according to one example of the principles described herein. The method of FIG. 5 may begin by overmolding (block 501) a number of die (103) with an overmold material (102) to form a coplanar package (102, 103). The die (103) includes a number of electrically active devices (104, 107). The method of FIG. 5 may continue by forming (block 502) a fan-out layer (111) on the coplanar package (102, 103) to increase distances between a number of features of the die (103). The fan-out layer (111) includes a number of fluid channels (401) formed therein that interface with the electrically active devices (104, 107) of the die (103) and cause a fluid to flow to the electrically active devices (104, 107). The method of FIG. 5 may include coupling a carrier (202) to the die (103) via a releasable adhesive (203), overmolding (block 501) the die (103) using the carrier (202) to handle the die (103), removing the carrier (202), and forming (block 502) the fan-out layer (111) in place of the carrier (202).

In one example, forming (block 502) the fan-out layer (111) includes depositing material via polymer thin-coating and photo-developing, injection molding, three-dimensional printing, photolithography deposition, or other structure forming processes. In one example, the fan-out layer (111) includes a radiation-sensitive chemical photoresist. In this example, the photolithography deposition process includes depositing a layer of the photoresist, irradiating the layer of the photoresist with a pattern of radiation, and remove un-irradiated portions of the photoresist using a developer.

The method of FIG. 5 may include coupling an electrical redistribution layer (RDL) (301) positioned between the fan-out layer (111) and the die (103) to electrically couple the electrically active devices (104, 107) to an external circuit.

Figure 6:
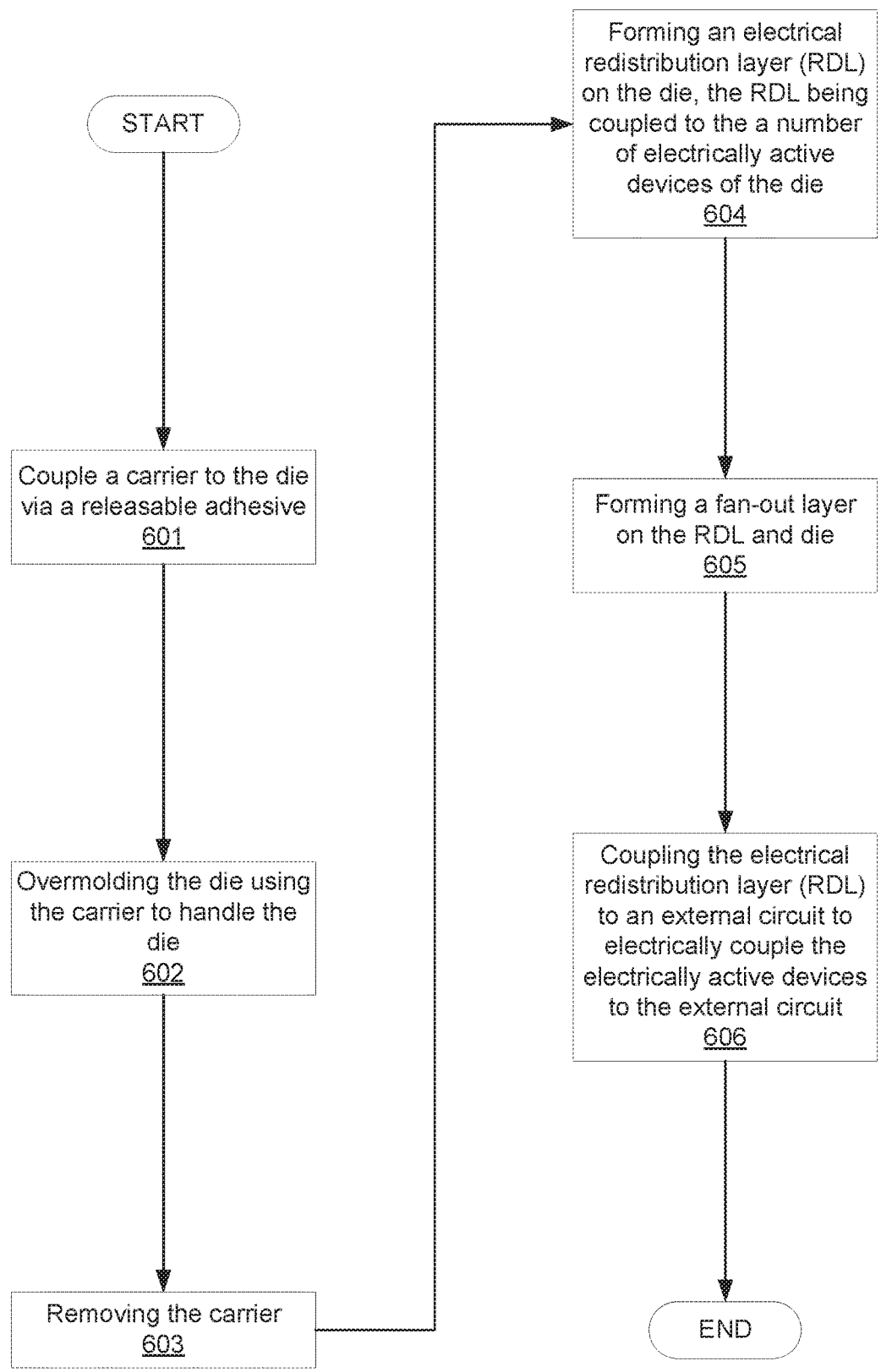
FIG. 6 is a flowchart depicting a method of forming fluid channels in a MEMS device, according to another example of the principles described herein.

FIG. 6 is a flowchart depicting a method of forming fluid channels (401) in a MEMS device (101), according to another example of the principles described herein. The method of FIG. 6 may begin by coupling (block 601) a carrier (202) to the die (103) via a releasable adhesive (203). The sides of the die (103) exposed are overmolded (block 602) using the carrier (202) to handle the die (103). The carrier (202) is removed at block 603, and an electrical redistribution layer (RDL) (301) is formed (block 604) on the die (103). The RDL (301) is coupled to a number of electrically active devices (104, 107) of the die (103). The method may continue by forming (block 605) a fan-out layer (111) on the RDL (301) and die (103), and coupling (block 606) the RDL (301) to an external circuit to electrically couple the electrically active devices (104, 107) to the external circuit.

The methods and systems described herein may also be used in connection with a lab-on-chip (LOC) system. In this example, the LOC includes a plurality of silicon die (103), and a number of electrically active devices (104, 107) disposed on a first side of the silicon die (103). An overmold material (102) is overmolded over all sides of the silicon die (103) other than the first side. A fan-out layer (111) is coupled to each of the silicon die (103). The fan-out layer (111) includes a number of fluid channels (401) formed therein that interface with the electrically active devices (104, 107). An electrical redistribution layer (RDL) (301) is positioned between the fan-out layer (111) and the die (103) to electrically couple the electrically active devices (104, 107) to an external circuit.

The LOC system may include a number of reagents disposed within the LOC system to react with a fluid introduced into the LOC system. In one example, the fan-out layer (111) includes a manifold including a plurality of the fluid channels (401). The LOC system may further include a plurality of fluid input/output ports (105, 106) defined in the fan-out layer (111) coupling the fluid channels (401) to an exterior environment of the LOC system. The fluid input/output ports (105, 106) may be spaced out with respect to one another a greater distance than a dimension of a plane of the silicon die (103) that interfaces with the fan-out layer (111). In this manner, distances between elements within a silicon die (103) assembly and between elements of neighboring silicon die assemblies within an array (100) is increased in order to provide for interfacing with the array (100) and the individual silicone die (103). In one example, a plurality of fluidic structures and devices such as reagent storages, input/output ports, fluidic mixing devices, pumps, PCR devices, and sensors, among others, may be connected together to perform different tasks within a system of MEMS devices that perform an overall process.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, a processor or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

The specification and figures describe a microelectromechanical systems (MEMS) device. The MEMS device includes a number of silicon die overmolded with an overmold material, a number of active areas formed on the silicon die, the active areas including at least one sensor to sense a number of attributes of a fluid introduced to the at least one sensor, and a fan-out layer coupled to the silicon die, the fan-out layer including a number of fluid channels formed therein that interface with active areas of the silicon die and allow the fluid to flow to the at least one sensor.

The overmolding of the sliver die allows for the input/output ports to be enlarged and spaced apart from one another such that users can have enough room on the device to easily deposit the analyte fluid in a given input/output port without fear of depositing the analyte fluid in a neighboring input/output port. The coplanar substrate with the dies that leverage integrated circuit processing and equipment. Further, the examples described herein provide precise and well aligned micro-fluidic structures for sensors in the micron or nano-scale. Further, the MEMS systems describe herein provide a low-cost solution since most of substrate area is made out of an overmold material such as epoxy mould compound (EMC). Further, examples described herein enable the integration of multiple sensors, actuators, application specific integrated circuits (ASICs), electrical connectors, electrical redistribution layers (RDL), fluidic channels, or other devices in a coplanar substrate. The fan-out die arrangement reduces costs associated with manufacturing and materials, and reduces complexity of fluidic interface to external environments. Still further, the input/output ports may be larger than the device die area to provide a relatively smaller device that provides an intended functionality at a reduced cost. Large input/output ports may be integrated in the MEMS device without significant cost increase since most of the area of the MEMS device is made out of the overmold material (e.g., EMC) instead of the relatively more expensive silicon. For example, sliver sensor dies may be spaced or "fanned-out" in the EMC, and provide more space for the fluidic routing and the input/output ports.

The preceding description has been presented to illustrate and describe examples of the principles described. This description is not intended to be exhaustive or to limit these principles to any precise form disclosed. Many modifications and variations are possible in light of the above teaching.

What is claimed is:

1. A microelectromechanical systems (MEMS) device comprising:
    a number of silicon dies overmolded with an overmold material;
    a number of active areas formed on the silicon dies, the active areas comprising at least one sensor to sense a number of attributes of a fluid introduced to the at least one sensor; and
    a fan-out layer coupled to the silicon dies, the fan-out layer comprising a number of fluid channels formed therein that interface with the active areas of the silicon dies and allow the fluid to flow to the at least one sensor, the fan-out layer further comprising a number of fluid input/output ports spaced laterally so as to extend beyond a nearest edge of a corresponding silicon die in the overmold material, the input/output ports being fluidly connected through the number of fluid channels of the fan-out layer to the active areas of the number of silicon dies.

2. The MEMS device of claim 1, wherein two of the fluid input/output ports defined in the fan-out layer are spaced farther apart than a width of a corresponding silicon die to which they are fluidly coupled.

3. The MEMS device of claim 1, wherein the active areas further comprise a number of actuators to cause the fluid introduced into the fluid channels to interact with the sensors.

4. The MEMS device of claim 1, wherein the active areas comprise a reagent storage to store a number of reagents to react with the fluid introduced into the fluid channels.

5. The MEMS device of claim 1, wherein the MEMS device comprises a surface area comprising at least a majority of the overmold material relative to silicon of the silicon dies.

6. The MEMS device of claim 1, wherein the overmold material is an epoxy mold compound (EMC).

7. The MEMS device of claim 1, further comprising two input/output ports located on opposite sides of a silicon die to which both of the two input/output ports are fluidly connected via the fluid channels, the two input/output ports being spaced farther apart than a width of the silicone die between them.

8. The MEMS device of claim 1, wherein the number of fluid channels of the fan-out layer comprise channels that move fluid over a boundary between the overmold material and an edge of one of the silicon dies.

9. The MEMS device of claim 1, wherein one of the number of silicon dies comprises both an actuator to move fluid and a sensor to sense fluid.

10. The device of claim 9, wherein the actuator comprises a fluid mixer.

11. The MEMS device of claim 9, wherein the actuator comprises a fluid pump.

12. A method of forming a microelectromechanical systems (MEMS) device comprising:
    overmolding a number of dies with an overmold material to form a coplanar package, the dies comprising a number of electrically active devices; and
    forming a fan-out layer on the coplanar package to increase distances between a number of features of the dies, the fan-out layer comprising a number of fluid channels formed therein that interface with the electrically active devices of the dies and cause a fluid to flow to the electrically active devices, the fan-out layer further comprising a number of fluid input/output ports spaced laterally so as to extend beyond a nearest edge of a corresponding die in the overmold material, the input/output ports being fluidly connected through the number of fluid channels of the fan-out layer to the active devices of the number of dies.

13. The method of claim 12, further comprising:
    coupling a carrier to the dies via a releasable adhesive;
    overmolding the dies using the carrier to handle the dies;
    removing the carrier; and
    forming the fan-out layer on the dies.

14. The method of claim 12, further comprising coupling an electrical redistribution layer (RDL) to the dies between the fan-out layer and the dies to electrically couple the electrically active devices to an external circuit.

15. The method of claim 12, wherein forming the fan-out layer comprises depositing material via photolithography deposition processes.

16. The method of claim 15, wherein:
    the fan-out layer comprises a radiation-sensitive chemical photoresist; and
    the photolithography deposition process comprises:
        depositing a layer of the photoresist;
        irradiating the layer of the photoresist with a pattern of radiation; and
        remove un-irradiated portions of the photoresist using a developer.

17. A lab-on-chip system comprising:
    a plurality of silicon dies;
    a number of electrically active devices disposed on a first side of the silicon dies;
    an overmold material overmolded over all sides of the silicon dies other than the first side;
    a fan-out layer coupled to each of the silicon dies, the fan-out layer comprising a number of fluid channels formed therein that interface with the electrically active devices; and
    an electrical redistribution layer (RDL) positioned between the fan-out layer and the silicon dies to electrically couple the electrically active devices to an external circuit;
    wherein the active devices further comprise a number of actuators and a number of sensors, the number of actuators to cause fluid introduced into the fluid channels to interact with number of sensors.

18. The lab-on-chip system of claim 17, further comprising a number of reagents disposed within the lab-on-chip system to react with a fluid introduced into the lab-on-chip system.

19. The lab-on-chip system of claim 17, wherein the number of fluid channels formed in the fan-out layer comprises a plurality of the fluid channels.

20. The lab-on-chip system of claim 17, further comprising a plurality of fluid input/output ports defined in the fan-out layer coupling the fluid channels to an exterior environment, wherein the fluid input/output ports are spaced out with respect to one another a greater distance than a dimension of a plane of the silicon dies that interfaces with the fan-out layer.

* * * * *